US010594113B2

(12) United States Patent
Liao et al.

(10) Patent No.: US 10,594,113 B2
(45) Date of Patent: Mar. 17, 2020

(54) LASER TRIGGERED MULTI-STAGE VACUUM SWITCH

(71) Applicant: Dalian University of Technology, Dalian (CN)

(72) Inventors: Minfu Liao, Dalian (CN); Xiongying Duan, Dalian (CN); Zhanqing Chen, Dalian (CN); Jiyan Zou, Dalian (CN); Enyuan Dong, Dalian (CN); Yongxing Wang, Dalian (CN); Zhihui Huang, Dalian (CN); Hao Zhang, Dalian (CN)

(73) Assignee: DALIAN UNIVERSITY OF TECHNOLOGY, Dalian, Liaoning (CN)

( * ) Notice: Subject to any disclaimer, the term of this patent is extended or adjusted under 35 U.S.C. 154(b) by 0 days.

(21) Appl. No.: 16/469,597

(22) PCT Filed: Mar. 21, 2018

(86) PCT No.: PCT/CN2018/079877
§ 371 (c)(1),
(2) Date: Jun. 13, 2019

(87) PCT Pub. No.: WO2019/104908
PCT Pub. Date: Jun. 6, 2019

(65) Prior Publication Data
US 2019/0319432 A1    Oct. 17, 2019

(30) Foreign Application Priority Data
Nov. 30, 2017 (CN) .......................... 2017 1 1240735

(51) Int. Cl.
*H01T 2/00* (2006.01)
(52) U.S. Cl.
CPC ..................................... *H01T 2/00* (2013.01)

(58) Field of Classification Search
None
See application file for complete search history.

(56) References Cited

U.S. PATENT DOCUMENTS

2011/0215717 A1    9/2011  Chen et al.

FOREIGN PATENT DOCUMENTS

| CN | 101820275 A | * | 9/2010 | ............. H01H 33/66 |
| CN | 101820275 A |   | 9/2010 | |

(Continued)

OTHER PUBLICATIONS

Minfu et al., Laser Triggered Multistage Gas-Vacuum Mixed Switch, Transactions of China Electrotechnical Society, vol. 30, No. 9, May 2015, 5 pages.

*Primary Examiner* — Dedei K Hammond
(74) *Attorney, Agent, or Firm* — Muncy, Geissler, Olds & Lowe, P.C.

(57) ABSTRACT

High voltage high power pulsed power switches relating to a laser triggered multi-stage vacuum switch. The laser triggered multi-stage vacuum switch has laser triggered vacuum gap, multi-stage self-breakdown vacuum gaps and trigger system. Multi-stage self-breakdown vacuum gaps are fixed on the top of laser triggered vacuum gap by connector. The grading ring is sheathed outside of upper insulation shell. By adopting the series connected laser triggered vacuum gap and multi-stage self-breakdown vacuum gaps, with the synergy of two type vacuum gaps, application of laser triggered multi-stage vacuum switch in the high voltage, high power, high repetitive frequency pulsed power system can be realized. With multiple laser beams shot onto multiple targets, more initial plasma can be generated as the irradiation area of laser on target surfaces is enlarged, and the trigger performances of laser triggered multi-stage vacuum switch can be enhanced.

3 Claims, 4 Drawing Sheets (56) References Cited

FOREIGN PATENT DOCUMENTS

| CN | 103066497 | A | | 4/2013 |
|----|-----------|---|---|--------|
| CN | 104113314 | A | | 10/2014 |
| CN | 204119196 | U | | 1/2015 |
| CN | 107743031 | A | | 2/2018 |
| CN | 107888174 | A | * | 4/2018 |
| CN | 207475522 | U | | 6/2018 |

* cited by examiner

LASER TRIGGERED MULTI-STAGE VACUUM SWITCH

TECHNICAL FIELD

The present invention belongs to the technical field of high voltage high power pulsed power switches, and relates to a laser triggered multi-stage vacuum switch.

BACKGROUND

With the development of researches on the high power, high repetitive frequency pulsed power technology in China and the rising capacity of pulsed power system, there are stronger demands for better working performances of pulsed power switches, such as its delay time, current capacity, high frequency interruption capacity, lifetime, and so on. The widely used pulsed power switches mainly include triggered gas switches and triggered vacuum switches these years, and the trigger methods of these switches can be divided as electrical impulse triggered and pulsed laser triggered. The electrical triggered switches adopt trigger electrode placed in main gap to generate initial plasma by impulsive discharge, and closing the switch. The preferable trigger performances of electrical triggered switches need relative higher under voltage ratio and larger trigger voltage, limiting its application fields and the miniaturization of its trigger system. And there are severe arc ablation effects on the trigger electrodes and the coating materials on trigger electrodes after the closing of electrical triggered switches, affecting its closing performances and lifetime. Laser triggered switches adopt pulsed laser as trigger source, electrically insulated the trigger system with the main gap. And the main gap can be closed with the initial plasma generated by the interactions of high energy laser beam with targets. Compared to electrical triggered method, laser triggered switches can avoid the arc ablations on trigger electrode, and show many advantages, such as shorter delay time, higher trigger accuracy, easily controlled, repetitive triggered, and so on. Thus the high power, high repetitive frequency pulsed power systems generally employ laser triggered method.

Most of laser triggered gas switches adopt the electronegative gases with better insulation capacity as its insulation and arc interruption dielectrics, for example $SF_6$ gas, and delay time of the switches can be controlled within dozens of nanoseconds. To satisfy the requirements for switches with better working performances in high voltage, high power pulsed power system, the MV level laser triggered multi-stage multi-channel gas switches composed of series connected laser triggered gas gap and multi-stage self-breakdown gas gaps are proposed by researchers. And the switches normally adopt gas mixtures of $SF_6/N_2$ as its insulation and arc interruption dielectric. Instantaneous power of the switches can reach terawatt level, and the delay time can be controlled within 10 ns. But limited by the properties of $SF_6$ gas, the repetitive frequency performances of switches are unsatisfied. And the working performances of switches are also affected by the decomposed $SF_6$ gas during arcing process, thus the insulation gas needs to be replaced regularly, raising the cost of gas switches.

Laser triggered vacuum switches adopt vacuum as its insulation and interruption dielectric, and shows many advantages, such as with larger current capacity, higher reliability, proper repetitive frequency performances, maintenance-free, and so on, and the better trigger performances can be obtained compared to laser triggered gas switches under same working conditions. Researches on high power laser triggered switches these years mainly concentrate on laser triggered gas switches, few works pay attention to high voltage, high power laser triggered vacuum switches. Due to the nonlinear growth relationships between vacuum gap distance and withstand voltage, the developments of high voltage laser triggered vacuum switch are limited. Based on the researches on multi-break vacuum circuit breakers and laser triggered multi-stage gas switches, laser triggered multi-stage vacuum switch composed of laser triggered vacuum gap and multi-stage self-breakdown vacuum gaps are proposed. The distance of serial vacuum gaps, the structures of electrodes, and trigger system can be properly designed and configured to satisfy the requirements of pulsed power switches with higher operating voltage and better trigger performances. The switch utilizes the trigger advantages of laser triggered vacuum gap and the insulation and arc interruption capacity of short vacuum gaps, enhancing the working performances of pulsed power switches and decreasing the maintenance costs.

SUMMARY

The purpose of the present invention is to provide a high voltage, high power laser triggered multi-stage vacuum switch composed of laser triggered vacuum gap and multi-stage self-breakdown vacuum gaps in series. Multiple paralleled laser beams with same laser energies shot onto multiple targets at the same time with the designed trigger system, elevating the trigger performances of laser triggered vacuum gap; thus preferable trigger performances can be obtained from the laser triggered multi-stage vacuum switch with the cooperation of laser triggered vacuum gap with multi-stage self-breakdown vacuum gaps. And the repetitive interruption capacity of laser triggered multi-stage vacuum switch can be enhanced by regulating the synergy effects of magnetic fields in self-breakdown vacuum gaps with the designed electrode structures.

The technical solution of the present invention is as follows:

A laser triggered multi-stage vacuum switch, comprising of laser triggered vacuum gap, multi-stage self-breakdown vacuum gaps, and trigger system.

Multi-stage self-breakdown vacuum gaps is fixed on the top of laser triggered vacuum gap by connector 7, grading ring 6 is sheathed outside of upper insulation shell 3.

The laser triggered vacuum gap includes lower insulation shell 9, upper cover flange of triggered gap 8, shielding of triggered gap 19, lower cover flange of triggered gap 10, cathode conducting rod 15, plate cathode with multiple targets 20, target materials 22, plate anode with multiple laser channels 21, anode conducting rod with multiple laser channels 11, bellows 23, lens 12, and baffle board 13.

The top and bottom of lower insulation shell 9 are separately sealed by upper cover flange 8 and lower cover flange of triggered gap 10.

Shielding of triggered gap 19 is fixed in lower insulation shell 9 to optimize the electric field distribution in laser triggered vacuum gap. The plate cathode with multiple targets 20 and the plate anode with multiple laser channels 21 are placed inside the shielding of triggered gap 19 with relative position.

The plate cathode with multiple targets 20 is connected on cathode conducting rod 15 and fixed on upper cover flange of triggered gap 8. The plate anode with multiple laser channels 21 is connected with anode conducting rod with multiple laser channels 11, and the anode conducting rod with multiple laser channels 11 is fixed on lower cover flange of triggered gap 10 through the bellows 23. The relative positions of laser channels 14 on plate anode with multiple laser channels 21 are correspond one to one with the target materials 22 on plate cathode with multiple targets 20.

The lens 12 is sealed to the bottom of anode conducting rod 11, and the lens 12 is covered and protected by the baffle board 13. The baffle board 13 is fixed on the anode conducting rod with multiple laser channels 11, and located at outside of lower cover flange of triggered gap 10. There are through-holes on the baffle board 13 corresponding with the laser channels 14.

The multi-stage self-breakdown vacuum gaps include upper insulation shell 3, upper cover flange of self-breakdown gaps 2, shieling of self-breakdown gaps 16, lower cover flange of self-breakdown gaps 4, conducting rod at low voltage side 1, insulator 18, circular self-breakdown electrodes 17, and conducting rod at high voltage side 5.

The top and bottom of upper insulation shell 3 are separately sealed by upper cover flange 2 and lower cover flange 4 of the self-breakdown gaps. Multiple shielding of self-breakdown gaps 16 are separately fixed inside of upper insulation shell 3, optimizing the electric fields in multi-stage self-breakdown vacuum gaps.

The conducting rod at high voltage side 5 is sealed and fixed on the lower cover flange of self-breakdown gaps 4. The top of conducting rod 5 is connected with circular self-breakdown electrodes 17, and the bottom of conducting rod 5 is connected with the cathode conducting rod 15.

Multiple circular self-breakdown electrodes 17 and insulators 18 are connected in series, and fixed inside of the shielding of self-breakdown gaps 16.

The insulator 18 is a cylinder with umbrella on its side face, and there is a cylindrical salient on its top and a cylindrical groove on its bottom. The insulator 18 at the bottom is coupled and connected with conducting rod at high voltage side 5. Multiple insulators 18 match with each other and connected in series, and every two insulators 18 clamp the inner ring of a circular self-breakdown electrode 17.

The diameter of center circle of circular self-breakdown electrode 17 equals to the diameter of cylindrical salient on insulator 18, and the thickness of inner ring of electrode is lower than that of the outer ring, while the outer ring is main discharge electrode. Current goes through the outer ring after the triggering of serial gaps, and the directions and strengths of magnetic fields in self-breakdown vacuum gaps change with the structure of outer rings of electrodes during the closing period. The inner ring of first stage circular self-breakdown electrode is clamped between high voltage conducting rod 5 and insulator 18, and multi-stage overvoltage breakdown vacuum gaps can be formed by the series connected electrodes and insulators.

There is a cylindrical groove on the bottom of conducting rod at low voltage side 1, and the groove is coupled with the cylindrical salient on insulator 18. The conducting rod 1 is fixed and sealed on the center of upper cover flange 2. And the last circular self-breakdown electrode 17 is clamped between conducting rod 1 and laser insulator 18 by the coupled groove and salient.

The circular self-breakdown electrodes in the switch 17 are the combination of one or more of followed electrode structures, including plate type, axial magnetic field type, and transverse magnetic field type.

The trigger system includes trigger controller 24, laser 25, optical fiber 26, 4:1 spectroscope 27, 3:1 spectroscope 28, 2:1 spectroscope 36, 1:1 spectroscope 33, mirror A 30, mirror B 32, mirror C 35, mirror D 29, focus lens A 31, focus lens B 34, focus lens C 37, focus lens D 38.

The trigger controller 24 is employed to receive the commands from control system, and control the trigger of laser 25 to generate pulsed laser by optical fiber 26. The laser beam from laser 25 is divided and focused to 5 paralleled laser beams (up, down, left, right, and middle) with same laser energy by the spectroscopes, mirrors, and focused lens.

The laser beam from laser 25 is divided by 4:1 spectroscope 27 at first, and the reflected laser beam by spectroscope 27 is reflected and focused by mirror B 32 and focus lens B 34, forming downside laser beam. The laser beam through 4:1 spectroscope 27 is divided by 3:1 spectroscope 28, and the reflected laser beam by spectroscope 28 is reflected and focused by mirror C 35 and focus lens C 37, forming left side laser beam. The laser beam through 3:1 spectroscope 28 is divided by 2:1 spectroscope 36, and reflected laser beam by spectroscope 36 is reflected and focused by mirror D 29 and focus lens D 38, forming right side laser beam. The laser beam through 2:1 spectroscope 36 is divided by 1:1 spectroscope 33, and the reflected laser beam by spectroscope 33 is reflected and focused by mirror A 30 and focus lens A 31, forming upside laser beam. The laser beam through 1:1 spectroscope 33 is focused by center focus lens forming middle laser beam. 5 laser beams pass through lens 14 and focus on targets 22 surface, generating plenty of initial plasma to accelerate the trigger of laser triggered vacuum gap.

The beam split ratios, amounts and positions of spectroscopes, the amounts and positions of mirrors and focus lens can be modulated with the amounts and positions of targets and laser channels, for the purpose of forming more paralleled laser beams with same laser energy.

The present invention has the beneficial effects: The present invention adopts the series connected laser triggered vacuum gap and multi-stage self-breakdown vacuum gaps; with the synergy of two type vacuum gaps, the application of laser triggered multi-stage vacuum switch in the high voltage, high power, high repetitive frequency pulsed power system can be realized. With multiple laser beams shot onto multiple targets, more initial plasma can be generated as the irradiation area of laser on target surfaces is enlarged, and trigger performances of laser triggered multi-stage vacuum switch can be enhanced; meanwhile, lifetime of the switch can be extended as the ablation effects of laser beam on targets are decreased. By regulating the configurations of circular self-breakdown electrodes in multi-stage self-breakdown vacuum gaps, stronger repetitive interruption capacity of laser triggered multi-stage vacuum switch can be obtained with the adjusted magnetic fields in the switch. The high costs and complex processes for the long-term maintenances of switches can be decreased by employing the laser triggered multi-stage vacuum switch.

In above figures, 1 is the conducting rod at low voltage side, 2 is upper cover flange of self-breakdown gaps, 3 is upper insulation shell, 4 is lower cover flange of self-breakdown gaps, 5 is conducting rod at high voltage side, 6 is grading ring, 7 is connector, 8 is upper cover flange of triggered gap, 9 is lower insulation shell, 10 is lower cover flange of triggered gap, 11 is anode conducting rod with multiple laser channel, 12 is lens, 13 is baffle board, 14 is laser channel, 15 is cathode conducting rod, 16 is shielding of self-breakdown gaps, 17 is circular self-breakdown electrode, 18 is insulator, 19 is shielding of triggered gap, 20 is plate cathode with multiple targets, 21 is plate anode with multiple laser channel, 22 is target materials, 23 is bellows, 24 is trigger controller, 25 is laser, 26 is optical fiber, 27 is 4:1 spectroscope, 28 is 3:1 spectroscope, 29 is mirror D, 30 is mirror A, 31 is focus lens A, 32 is mirror B, 33 is 1:1 spectroscope, 34 is mirror B, 35 is mirror C, 36 is 2:1 spectroscope, 37 is focus lens C, 38 is focus lens D.

DETAILED DESCRIPTION

Specific embodiments of the present invention are further described below in combination with the technical solution and accompanying drawings.

Combined with the descriptions from FIG. 1 to FIG. 6, the laser triggered multi-stage vacuum switch is composed of laser triggered vacuum gap, multi-stage self-breakdown vacuum gaps and trigger system.

Figure 1:
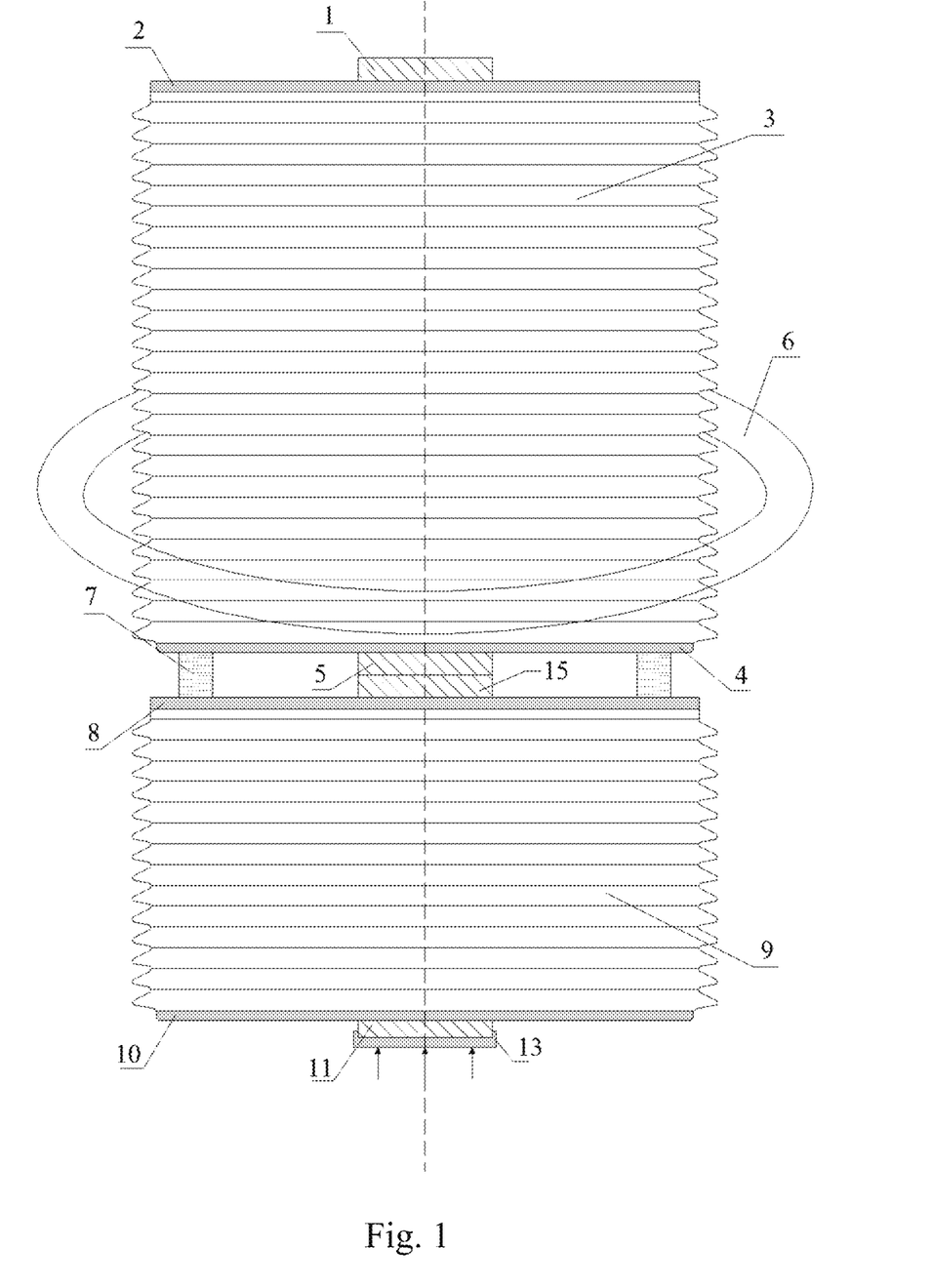
FIG. 1 is the structure schematic diagram of laser triggered multi-stage vacuum switch.
Figure 2:
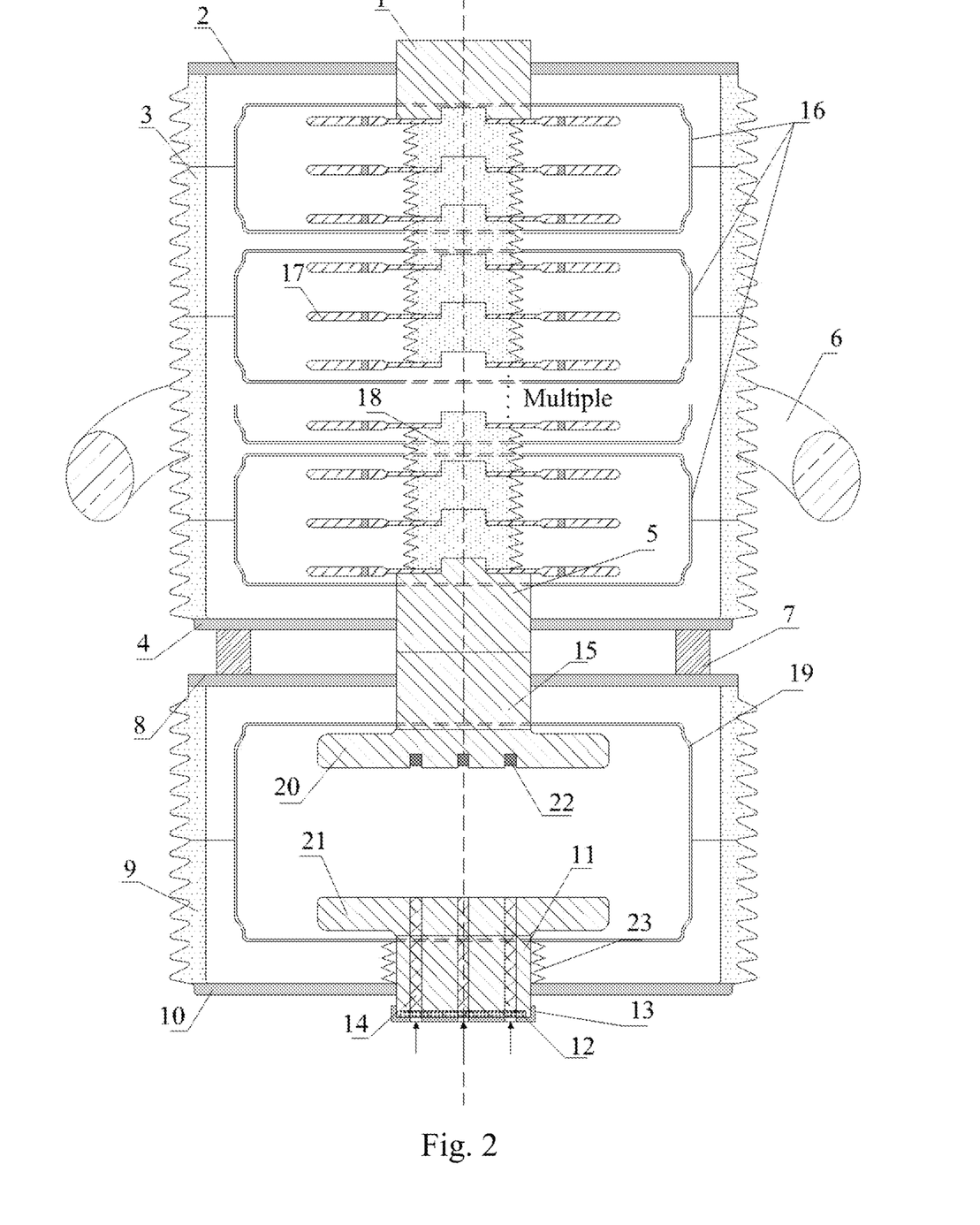
FIG. 2 is the internal structure schematic diagram of laser triggered multi-stage vacuum switch.

Multi-stage self-breakdown vacuum gaps is fixed on the top of laser triggered vacuum gap by connector 7, grading ring 6 is sheathed outside of upper insulation shell 3.

The laser triggered vacuum gap includes lower insulation shell 9, upper cover flange of triggered gap 8, shielding of triggered gap 19, lower cover flange of triggered gap 10, cathode conducting rod 15, plate cathode with multiple targets 20, target materials 22, plate anode with multiple laser channels 21, anode conducting rod with multiple laser channels 11, bellows 23, lens 12, and baffle board 13.

The top and bottom of lower insulation shell 9 are separately sealed by upper cover flange 8 and lower cover flange of triggered gap 10.

Shielding of triggered gap 19 is fixed in lower insulation shell 9 to optimize the electric field distribution in laser triggered vacuum gap. The plate cathode with multiple targets 20 and the plate anode with multiple laser channels 21 are placed inside the shielding of triggered gap 19 with relative position.

Figure 3:
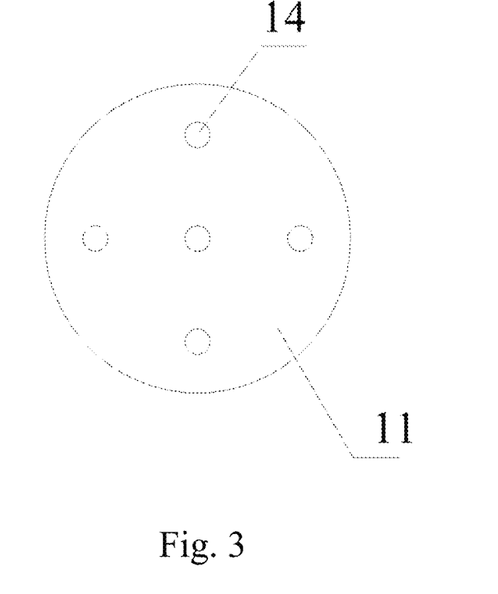
FIG. 3 is the top view of anode conducting rod with multiple laser channels.

The plate cathode with multiple targets 20 is connected on cathode conducting rod and fixed on upper cover flange of triggered gap 8. The plate anode with multiple laser channels 21 is connected with anode conducting rod with multiple laser channels 11, and the anode conducting rod with multiple laser channels 11 is fixed on lower cover flange of triggered gap 10 through the bellows 23. The relative positions of laser channels 14 on plate anode with multiple laser channels 21 are correspond one to one with the target materials 22 on plate cathode with multiple targets 20.

The lens 12 is sealed to the bottom of anode conducting rod 11, and the lens 12 is covered and protected by the baffle board 13. The baffle board 13 is fixed on the anode conducting rod 11, and located at outside of lower cover flange of triggered gap 10. There are through-holes on the baffle board 13 corresponding with the laser channels 14.

The multi-stage self-breakdown vacuum gaps include upper insulation shell 3, upper cover flange of self-breakdown gaps 2, shieling of self-breakdown gaps 16, lower cover flange of self-breakdown gaps 4, conducting rod at low voltage side 1, insulator 18, circular self-breakdown electrodes 17, and conducting rod at high voltage side 5.

The top and bottom of upper insulation shell 3 are separately sealed by upper cover flange 2 and lower cover flange 4 of the self-breakdown gaps. Multiple shielding of self-breakdown gaps 16 are separately fixed inside of upper insulation shell 3, optimizing the electric fields in multi-stage self-breakdown vacuum gaps.

The conducting rod at high voltage side 5 is sealed and fixed on the lower cover flange of self-breakdown gaps 4. The top of conducting rod 5 is connected with circular self-breakdown electrodes 17, and the bottom of conducting rod 5 is connected with the cathode conducting rod 15.

Multiple circular self-breakdown electrodes 17 and insulators 18 are connected in series, and fixed inside of the shielding of self-breakdown gaps 16.

The insulator 18 is a cylinder with umbrella on its side face, and there is a cylindrical salient on its top and a cylindrical groove on its bottom. The insulator 18 at the bottom is coupled and connected with conducting rod at high voltage side 5. Multiple insulators 18 match with each other and connected in series, and every two insulators 18 clamp the inner ring of a circular self-breakdown electrode 17.

Figure 4:
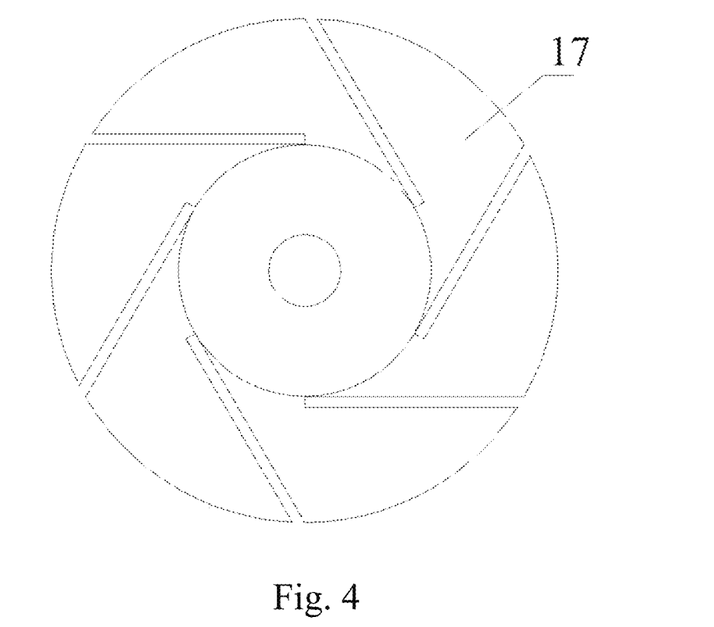
FIG. 4 is the schematic diagram of circular self-breakdown electrode with transverse magnetic field.

The diameter of center circle of circular self-breakdown electrode 17 equals to the diameter of cylindrical salient on insulator 18, and the thickness of inner ring of electrode is lower than that of the outer ring, while the outer ring is main discharge electrode. Current goes through the outer ring after the triggering of serial gaps, and the directions and strengths of magnetic fields in self-breakdown vacuum gaps change with the structure of outer rings of electrodes during the closing period. The inner ring of first stage circular self-breakdown electrode is clamped between high voltage conducting rod 5 and insulator 18, and multi-stage overvoltage breakdown vacuum gaps can be formed by the series connected electrodes and insulators.

There is a cylindrical groove on the bottom of conducting rod at low voltage side 1, and the groove is coupled with the cylindrical salient on insulator 18. The conducting rod 1 is fixed and sealed on the center of upper cover flange 2. And the last circular self-breakdown electrode 17 is clamped between conducting rod 1 and laser insulator 18 by the coupled groove and salient.

The circular self-breakdown electrodes in the switch 17 are the combination of one or more of followed electrode structures, including plate type, axial magnetic field type, and transverse magnetic field type.

Figure 5:
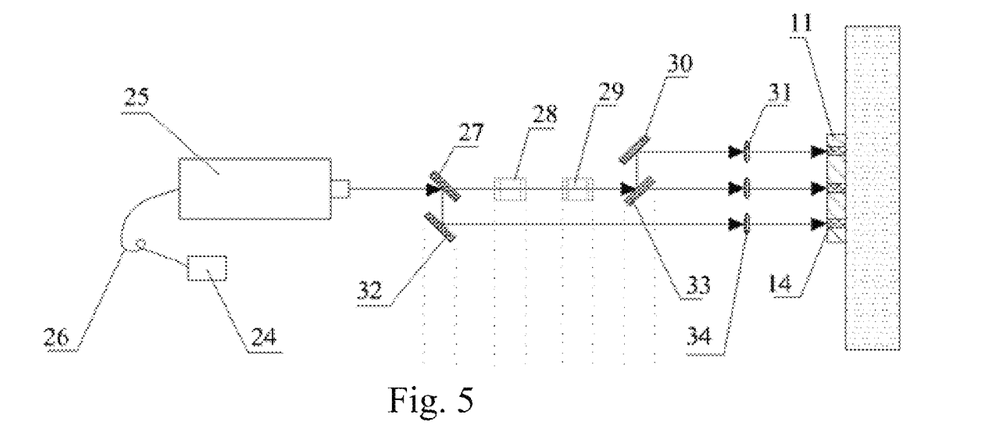
FIG. 5 is the side view of laser triggered system.
Figure 6:
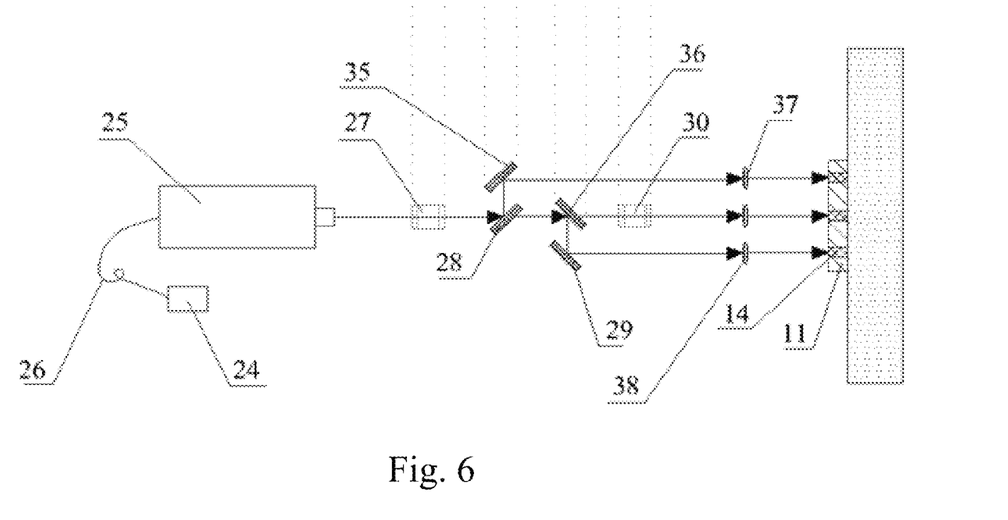
FIG. 6 is the top view of laser triggered system.

The trigger system includes trigger controller 24, laser 25, optical fiber 26, 4:1 spectroscope 27, 3:1 spectroscope 28, 2:1 spectroscope 36, 1:1 spectroscope 33, mirror A 30, mirror B 32, mirror C 35, mirror D 29, focus lens A 31, focus lens B 34, focus lens C 37, focus lens D 38.

The trigger controller is employed to receive the commands from control system, and control the trigger of laser 25 to generate pulsed laser by optical fiber 26. The laser beam from laser 25 is divided and focused to 5 paralleled laser beams (up, down, left, right, and middle) with same laser energy by the spectroscopes, mirrors, and focused lens.

The laser beam from laser 25 is divided by 4:1 spectroscope 27 at first, and the reflected laser beam by spectroscope 27 is reflected and focused by mirror B 32 and focus lens B 34, forming downside laser beam. The laser beam through 4:1 spectroscope 27 is divided by 3:1 spectroscope 28, and the reflected laser beam by spectroscope 28 is reflected and focused by mirror C 35 and focus lens C 37, forming left side laser beam. The laser beam through 3:1 spectroscope 28 is divided by 2:1 spectroscope 36, and reflected laser beam by spectroscope 36 is reflected and focused by mirror D 29 and focus lens D 38, forming right side laser beam. The laser beam through 2:1 spectroscope 36 is divided by 1:1 spectroscope 33, and the reflected laser beam by spectroscope 33 is reflected and focused by mirror A 30 and focus lens A 31, forming upside laser beam. The laser beam through 1:1 spectroscope 33 is focused by center focus lens forming middle laser beam. 5 laser beams pass through lens 14 and focus on targets 22 surface, generating plenty of initial plasma to accelerate the trigger of laser triggered vacuum gap.

The beam split ratios, amounts and positions of spectroscopes, the amounts and positions of mirrors and focus lens can be modulated with the amounts and positions of targets and laser channels, for the purpose of forming more paralleled laser beams with same laser energy.

The laser triggered multi-stage vacuum switch is put in insulating oil while the switch is opening, and the outer insulation of the switch is maintained by upper insulation shell 3, lower insulation shell 9 and insulating oil. The switch connects with outer circuit through the anode conducting rod 11 and the conducting rod 1. Under the effects of grading ring 6, shielding of self-breakdown gaps 16 and shielding of triggered gap 19, voltage distributions in laser triggered vacuum gap and multi-stage self-breakdown vacuum gaps are both uniformed, and voltage distributions between laser triggered vacuum gap and multi-stage self-breakdown vacuum gaps is with well-proportion; each vacuum gap maintains relative high under voltage ratios. And the under voltage ratio of laser triggered vacuum gap can be adjusted, as the gap distance of laser triggered vacuum gap can be regulated by controlling vertical positions of the anode conducting rod 11, and the conducting rod 11 is connected with bellows 23.

5 laser beams are focused by the focus lens, passing through 5 laser channels formed by lens 12, anode conducting rod with multiple laser channels 11 and plate anode with multiple laser channels 21, shooting on 5 targets 22 at plate cathode with multiple targets 20 at same time, and generating plenty of initial plasma, thus laser triggered multi-stage vacuum switch can obtain delay time within nanoseconds.

After the trigger of laser triggered gap, the operating voltage of laser triggered multi-stage vacuum switch is rapidly transferred onto the multi-stage self-breakdown vacuum gaps. Under the effects of formed impulse overvoltage, cascade breakdown appears on the outer rings of the series connected multiple circular self-breakdown electrodes 17, closing the laser triggered multi-stage vacuum switch finally. During the closing period of the switch, current goes through the outer rings of series connected different structure circular self-breakdown electrodes 17, and forming magnetic fields with different directions in the serial vacuum gaps. And these different directions magnetic fields can derive to synergy effects, accelerating the diffusion and quenching of vacuum arc in multi-stage vacuum gaps. And better interruption performances of laser triggered multi-stage vacuum switch can be obtained with the cooperation of laser triggered vacuum gap.

The invention claimed is:

1. A laser triggered multi-stage vacuum switch, comprising a laser triggered vacuum gap, multi-stage self-breakdown vacuum gaps and a trigger system;

the multi-stage self-breakdown vacuum gaps are fixed on the top of the laser triggered vacuum gap by a connector, and a grading ring is sheathed outside of an upper insulation shell;

the laser triggered vacuum gap includes a lower insulation shell, an upper cover flange of triggered gap, a shielding of the triggered gap, a lower cover flange of the triggered gap, a cathode conducting rod, a plate cathode with multiple targets, target materials, a plate anode with multiple laser channels, an anode conducting rod with multiple laser channels, a bellows, a lens, and a baffle board;

the top and bottom of the lower insulation shell are separately sealed by the upper cover flange and the lower cover flange of the triggered gap;

the shielding of the triggered gap is fixed in the lower insulation shell to optimize an electric field distribution in the laser triggered vacuum gap; the plate cathode with multiple targets and the plate anode with multiple laser channels are placed inside the shielding of the triggered gap with relative position;

the plate cathode with multiple targets is connected on the cathode conducting rod and fixed on the upper cover flange of the triggered gap; the plate anode with multiple laser channels is connected with the anode conducting rod with multiple laser channels, and the anode conducting rod with multiple laser channels is fixed on the lower cover flange of the triggered gap through the bellows; the relative positions of laser channels on the plate anode with multiple laser channels correspond one to one with the target materials on the plate cathode with multiple targets;

the lens is sealed to the bottom of the anode conducting rod with multiple laser channels, and the lens is covered and protected by the baffle board; the baffle board is fixed on the anode conducting rod with multiple laser channels, and located at outside of the lower cover flange of the triggered gap; there are through-holes on the baffle board corresponding with the laser channels;

the multi-stage self-breakdown vacuum gaps include the upper insulation shell, an upper cover flange of the self-breakdown gaps, a shielding of self-breakdown gaps, a lower cover flange of the self-breakdown gaps, a conducting rod at low voltage side, an insulator, circular self-breakdown electrodes, and a conducting rod at high voltage side;

the top and bottom of upper insulation shell are separately sealed by the upper cover flange and the lower cover flange of the self-breakdown gaps; multiple shielding of the self-breakdown gaps are separately fixed inside of the upper insulation shell, optimizing the electric fields in multi-stage self-breakdown vacuum gaps;

the conducting rod at high voltage side is sealed and fixed on the lower cover flange of the self-breakdown gaps; the top of the conducting rod at high voltage side is connected with the circular self-breakdown electrodes, and the bottom of conducting rod at high voltage side is connected with the cathode conducting rod;

the multiple circular self-breakdown electrodes and the insulator are connected in series, and fixed inside of the shielding of the self-breakdown gaps;

the insulator is a cylinder with umbrella on its side face, and there is a cylindrical salient on its top and a cylindrical groove on its bottom; the insulator at the bottom is coupled and connected with the conducting rod at the high voltage side; the multiple insulators match with each other and are connected in series, and every two insulators clamp the inner ring of the circular self-breakdown electrode;

the diameter of center circle of the circular self-breakdown electrode equals the diameter of the cylindrical salient on insulator, and the thickness of the inner ring of the electrode is lower than that of the outer ring, while the outer ring is a main discharge electrode; current goes through the outer ring after the triggering of serial gaps, and the directions and strengths of magnetic fields in the self-breakdown vacuum gaps change with the structure of the outer rings of electrodes during the closing period; the inner ring of first stage circular self-breakdown electrode is clamped between the high voltage conducting rod and the insulator, and the multi-stage overvoltage breakdown vacuum gaps can be formed by the series connected electrodes and insulators;

there is a cylindrical groove on the bottom of conducting rod at low voltage side, and the groove is coupled with the cylindrical salient on the insulator; the conducting rod is fixed and sealed on the center of the upper cover flange; and the last circular self-breakdown electrode is clamped between the conducting rod and the laser insulator by the coupled groove and salient;

the trigger system includes a trigger controller, a laser, an optical fiber, a 4:1 spectroscope, a 3:1 spectroscope, a 2:1 spectroscope, a 1:1 spectroscope, a mirror A, a mirror B, a mirror C, a mirror D, a focus lens A, a focus lens B, a focus lens C, a focus lens D;

the trigger controller is employed to receive the commands from control system, and controls the trigger of the laser to generate a pulsed laser by the optical fiber; the laser beam from the laser is divided and focused to 5 paralleled laser beams, namely up, down, left, right, and middle, with same laser energy by the spectroscopes, mirrors, and focused lens;

the laser beam from laser is divided by the 4:1 spectroscope at first, and the reflected laser beam by the 4:1 spectroscope is reflected and focused by the mirror B and the focus lens B, forming downside laser beam; the laser beam through the 4:1 spectroscope is divided by the 3:1 spectroscope, and the reflected laser beam by the 3:1 spectroscope is reflected and focused by the mirror C and the focus lens C, forming a left side laser beam; the laser beam through the 3:1 spectroscope is divided by the 2:1 spectroscope, and the reflected laser beam by the 2:1 spectroscope is reflected and focused by the mirror D and the focus lens D, forming a right side laser beam; the laser beam through the 2:1 spectroscope is divided by the 1:1 spectroscope, and the reflected laser beam by the spectroscope is reflected and focused by the mirror A and the focus lens A, forming an upside laser beam; the laser beam through the 1:1 spectroscope is focused by a center focus lens forming middle laser beam; 5 laser beams pass through the lens and focus on the targets surface, generating a plenty of initial plasma to accelerate the trigger of the laser triggered vacuum gap;

the beam split ratios, amounts and positions of spectroscopes, the amounts and positions of mirrors and focus lens can be modulated with the amounts and positions of targets and laser channels, for the purpose of forming more paralleled laser beams with same laser energy.

2. The laser triggered multi-stage vacuum switch according to claim 1, wherein the circular self-breakdown electrodes in the switch are the combination of one or more of the followed electrode structures, including plate type, axial magnetic field type, and transverse magnetic field type.

3. The laser triggered multi-stage vacuum switch according to claim 1, wherein the transmittance of the 4:1 spectroscope is 80%, the transmittance of the 3:1 spectroscope is 75%, the transmittance of the 2:1 spectroscope is 66%, and the transmittance of the 1:1 spectroscope is 50%.

* * * * *